(12) United States Patent
Liao et al.

(10) Patent No.: US 6,921,271 B2
(45) Date of Patent: Jul. 26, 2005

(54) SOCKET HAVING TERMINALS WITH RESLIENT CONTACT ARMS

(75) Inventors: Fang-Jwu Liao, Tu-Chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/822,099

(22) Filed: Apr. 9, 2004

(65) Prior Publication Data

US 2004/0203264 A1 Oct. 14, 2004

(30) Foreign Application Priority Data

Apr. 9, 2003 (TW) ..................... 92205557 U

(51) Int. Cl.[7] .......................................... H01R 12/00
(52) U.S. Cl. ...................................................... 439/66
(58) Field of Search ............................ 439/66, 71, 948

(56) References Cited

U.S. PATENT DOCUMENTS 6,196,852 B1 * 3/2001 Neumann et al. ............. 439/66
6,296,495 B1    10/2001 Wang et al.
6,604,950 B2 *  8/2003 Maldonado et al. .......... 439/66
6,705,876 B2 *  3/2004 Eldridge ....................... 439/66

* cited by examiner

Primary Examiner—Phuong Dinh
(74) Attorney, Agent, or Firm—Wei Te Chung

(57) ABSTRACT

A socket (20) includes a dielectric housing (30) and conductive terminals (40) secured in the housing. The housing defines upper and lower surface (322, 324) and a number of cells (320). Each terminal has a retention body (42) secured in a corresponding cell. The body has an upper end (422) flushed with the upper mating surface and a lower end (424) projected beyond the lower surface. Upper and lower protrusions (321, 323) extend from the upper and lower mating surfaces of the housing respectively, for supporting conductive pads (51, 53) of mating electrical devices. The lower protrusions project beyond the lower surface a vertical distance farer than that of the lower end. Thereby the pads can be prevented from electrically engaging the bodies when the mating electrical devices mate with the socket.

1 Claim, 6 Drawing Sheets

US 6,921,271 B2

SOCKET HAVING TERMINALS WITH RESLIENT CONTACT ARMS

BACKGROUND OF THE INVENTION

1. Field of the Invention

The present invention relates to the art of electrical connectors, and more particularly to a socket electrically mounted on an electrical substrate such as a printed circuit board (PCB), and including terminals each having a resilient contact arm adapted to mechanically and electrically engage a corresponding conductive member arranged on the electrical substrate.

2. Description of the Prior Art

Conventionally, a socket is widely used to electrically interconnect two electrical interfaces such as an IC package and a PCB, for conveniently and economically replacing of the IC. Referring to FIGS. 12, 13 and 14, the shown socket 90 includes a dielectric base 92 and terminals 94 secured in the base 92. To establish the above-mentioned electrical interconnection, each terminal 94 is provided with upper and lower resilient cantilever arms 942, 944. The upper arm 942 extends outside an upper surface 95 of the base 92 and is compressed to engage a pad 91 of an IC package 90A. For the same reason, the lower arm 944 extends beyond a lower surface 97 of the base 92, and is pressed to mate with a trace 93 of a PCB 90B. The terminal 94 further has a retention body 940. The upper and lower arms 942, 944 are connected to opposite ends of the retention body 940. The retention body 940 is secured in a passageway 96 of the base 92, thereby planting the terminal 94 in the base 92.

Before insertion of the terminal 94 into the base 92, one end of the retention body 940 of the terminal 94 is attached to a contact strip (not shown). After said insertion, the terminal 94 is cut off from the contact strip, the attached end 940A of the retention body 940 exposing outside of the passageway 96. A pressing tool 80 is applied to press or push the attached end 940A of the retention body 940, thereby to push the terminal 94 in the passageway 96.

However, in most occasions, after pressing or pushing, the attached end 940A still projects beyond the upper surface 95 from the passageway 96, or at most flushes with the upper surface 95. Consequently, after compressing of the upper and lower arms 942, 944 to respectively engage the pad 91 of the IC package 90A and the trace 93 of the PCB 90B, specifically in the case of that the upper and lower arms 942, 944 are over-compressed, the pad 91 is prone to electrically touch or engage the attached end 940A of an adjacent terminal 94 when the pad 91 has a relatively larger bottom mating face to engage the upper arm 942. If this happens, a short circuit is established between the two adjacent terminals 94. Consequently, a predetermined function of the IC package 90A is changed, even destroyed. U.S. Pat. No. 6,296,495 has the above disadvantages.

A new socket is, therefore, desired in light of the above problems.

SUMMARY OF THE INVENTION

Accordingly, an object of the present invention is to provide a socket able to avoid short circuits between pads of an IC package or traces of a PCB and terminals of the socket, even when contacting arms of the terminals are over-compressed or urged to engage said pads or said traces respectively.

To fulfill the above-mentioned object, the present invention applies a socket having a dielectric rectangular base and a plurality of terminals planted in the base. The base defines upper and lower surfaces, and an array of terminal-passageways between the upper and lower surfaces for corresponding terminals therein. A plurality of upper projections is symmetrically applied on the upper surface, a predetermined number of projections being positioned round one corresponding terminal-passageways. A plurality of lower protrusions is symmetrically applied on the lower surface, a predetermined number of protrusions being situated round one corresponding terminal-passageways. The upper projections each extend upwardly a uniform height h1 in a thickness direction of the base relative to the upper surface and the lower protrusions each project downwardly a uniform distance h2 in said direction relative to the lower surface.

Each terminal is configured with a retention body and upper and lower cantilever-shaped arms extending from opposite ends of the retention body. A contacting portion is formed at a topmost part of the upper arm. Said contacting portion extends outside a corresponding terminal-passage, thereby to mechanically and electrically engage a pad of an IC package. At a lowermost part of the lower arm is formed with an engaging section. The engaging section projects beyond the lower surface of the base, for mating with a trace of a PCB. The retention body is secured in a corresponding terminal-passageway, one upper end thereof flushing with the upper surface and one lower end thereof projecting beyond the lower surface a distance h3 in said direction. The distance h3 is lower than the distance h2 of the lower protrusions and the upper projections extend above the upper end of the retention body.

Accordingly, when the upper and lower arms are compressed to establish electrical engagement of the contacting portion and the engaging section with the pad and the trace, the pad and the trace are respectively prevented from electrically touching with the retention bodies of adjacent terminals, even if the upper and lower arms are over-compressed or urged toward each other. Reliability of electrical engagement of the socket with the IC package and the PCB is assured.

Other objects, advantages and novel features of the present invention will become more apparent from the following detailed description when taken in conjunction with the accompanying drawings.

BRIEF DESCRIPTION OF THE DRAWINGS

The features of the present invention which are believed to novel are set forth with particularity in the appended claims. The invention, together with its objects and the advantages thereof, may be best understood by reference to the following detailed description taken in conjunction with the accompanying drawings, in which like reference numerals identify like elements and in which:

DESCRIPTION OF PREFERRED EMBODIMENT OF THE INVENTION

Reference will now be made to the drawings to describe the present invention in detail.

Figure 1:
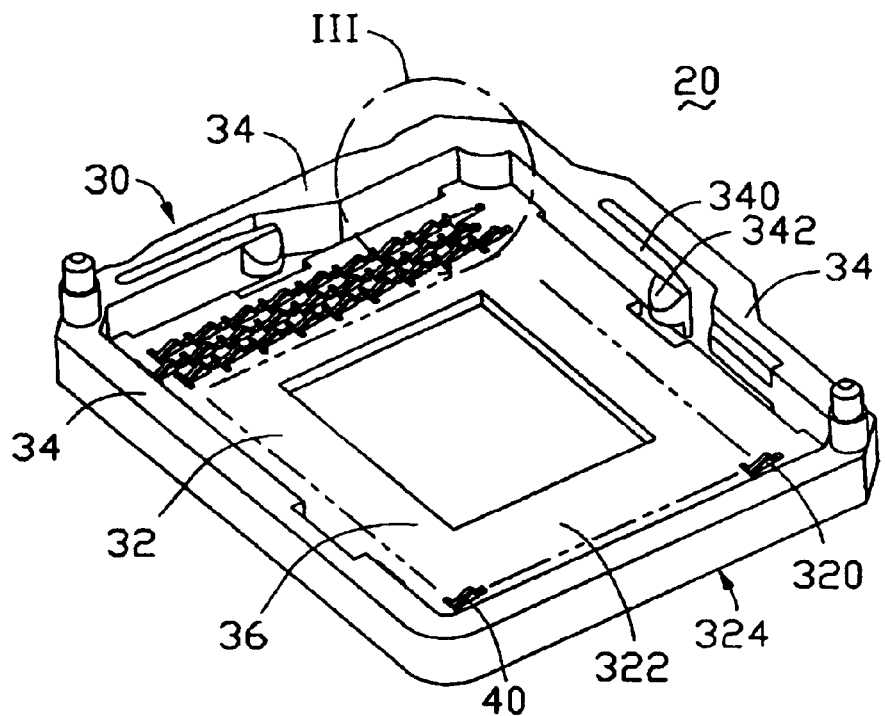
FIG. 1 is an isometric view of a socket according to the present invention, showing terminals received in terminal-passageways defined in a housing of the socket respectively.

Referring to FIG. 1, a socket 20 is provided according to a preferred embodiment of the present invention. The socket 20 is mainly used for electrically interconnecting two electrical devices, especially two parallel-orientated electrical device, such as a PCB 50B and an IC package 50A (best seen in FIG. 6). The socket 20 may, of course, be applied in other environments such as for electrically interconnecting two PCBs and so on.

The socket 20 includes a generally rectangular housing 30 and a plurality of terminals 40 secured in the housing 30. The housing 30 is formed from dielectric material, and configured with a bottom wall 32 and four side walls 34 extending upwardly from edges of the bottom wall 32. The side walls 34 and the bottom wall 32 cooperatively define a cavity 36 for receiving the IC package 50A therein.

A pair of resilient cantilevers 340 extends integrally from inner sides of two adjacent side walls 34 respectively, in a direction perpendicular or horizontal to the side walls 34. A projection 342 is formed at a distal end of each cantilever 340, for positioning the IC package 50A in the cavity 36.

Figure 3:
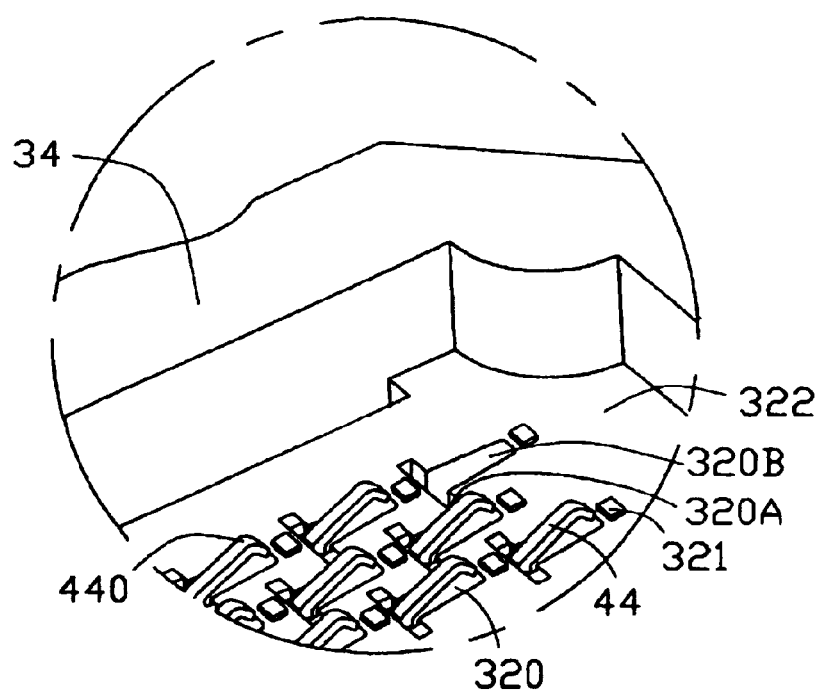
FIG. 3 is an enlarged view of a circled portion III of FIG. 1.
Figure 4:
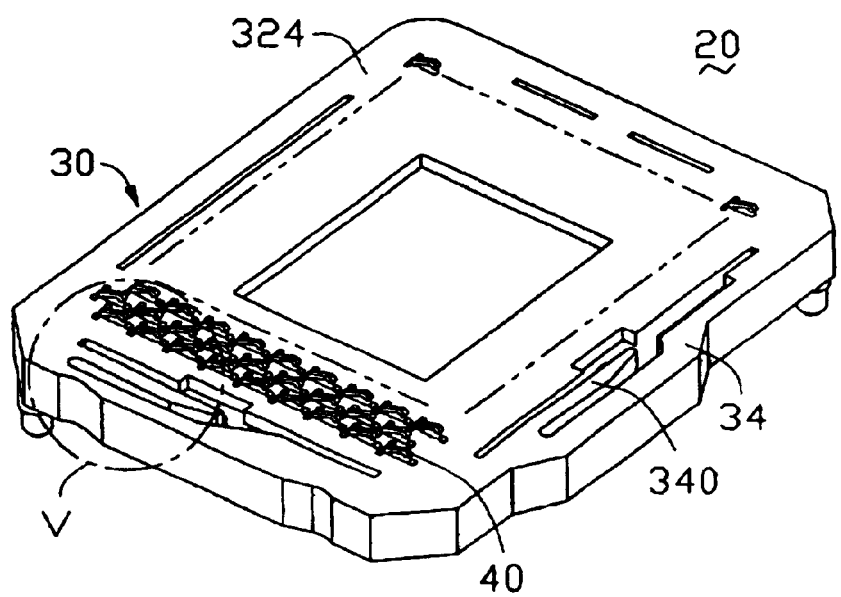
FIG. 4 is a reversed, isometric view of the socket of FIG. 1.
Figure 5:
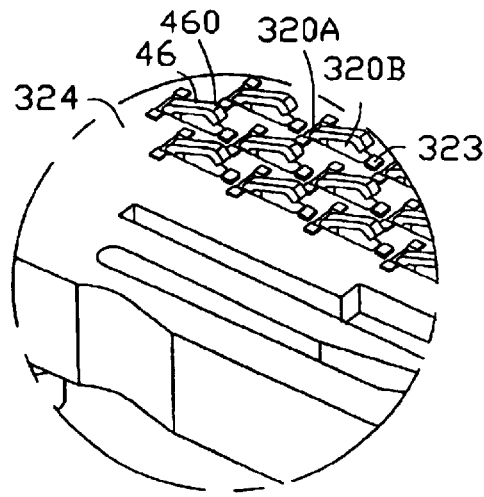
FIG. 5 is an enlarged view of a circled portion V of FIG. 4.

Referring also to FIG. 3, a top surface 322 is formed on a top of the bottom wall 32, for supporting the IC package 50A thereon. A bottom surface 324 is formed on a bottom of the bottom wall 32, for being mounted on the PCB 50B. An array of terminal-passageways 320 is defined in a center of the bottom wall 32, between the top and bottom surfaces 322, 324. Each terminal-passageway 320 has a T-shaped configuration, and includes a receiving section 320B and a securing section 320A vertical to and in communication with the receiving section 320B.

Figure 6:
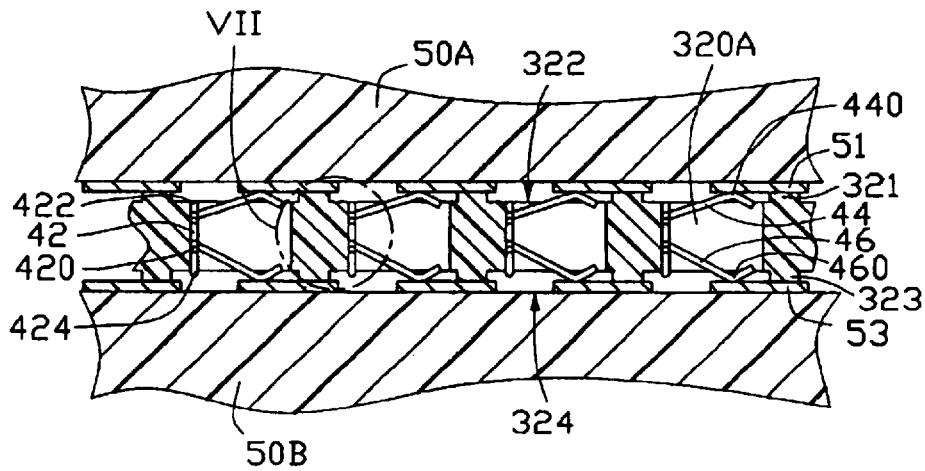
FIG. 6 is a cross section view of the socket, together with an IC package having pads engaged corresponding terminals and a PCB having traces said terminals.
Figure 7:
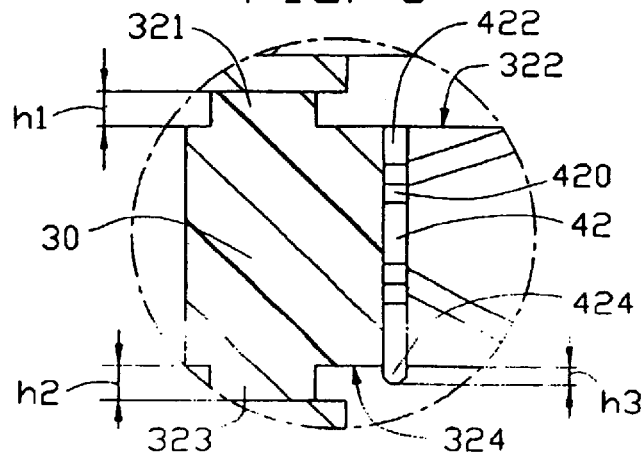
FIG. 7 is an enlarged view of a circled portion VII of FIG. 6.
Figure 8:
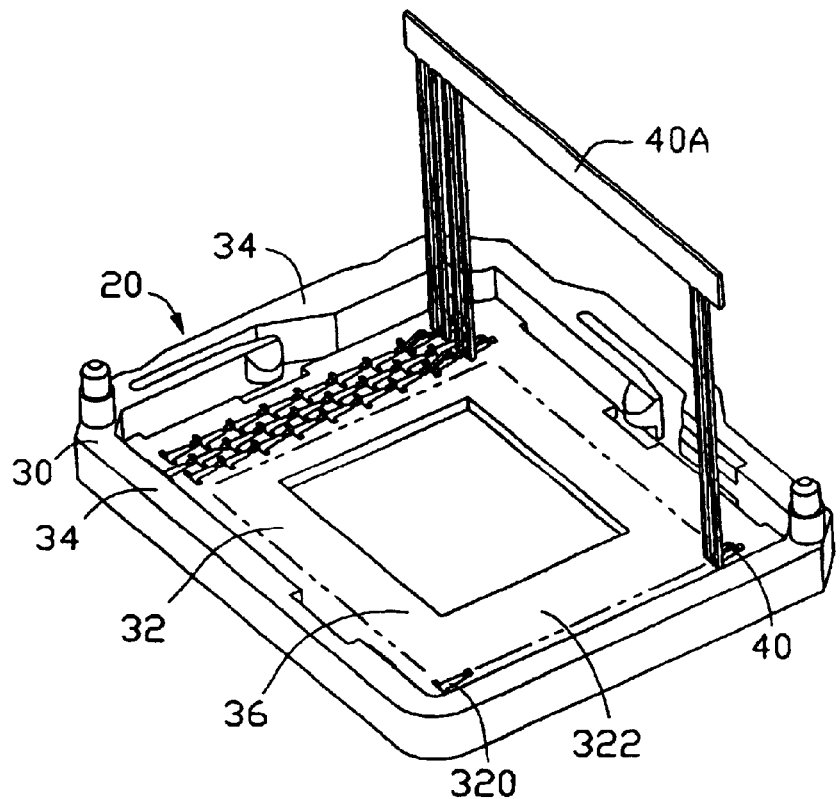
FIG. 8 is an assembled, isometric view of the housing, together with terminals pre-inserted in corresponding terminal-passageways, and showing a contact strip having terminals thereof pre-inserted into corresponding terminal-passageways.
Figure 9:
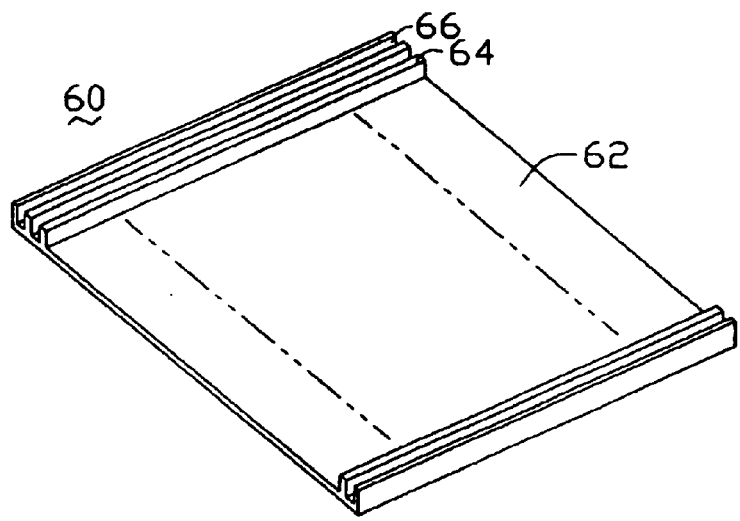
FIG. 9 is an isometric view of a tool for pressing the pre-inserted terminals into corresponding terminal-passageways.
Figure 10:
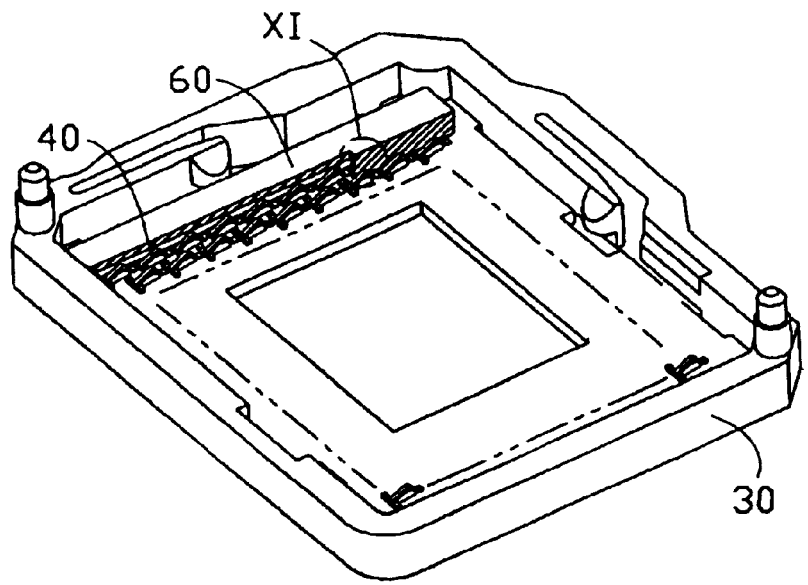
FIG. 10 is an isometric view of the socket, showing the tool pressing the pre-inserted terminals into the terminal-passageways.
Figure 11:
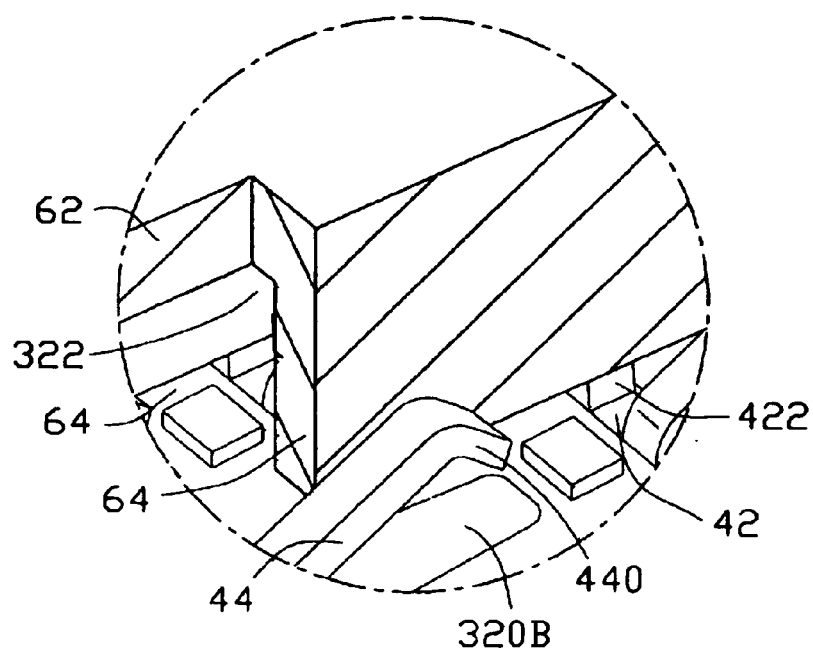
FIG. 11 is an enlarged view of a circled portion XI of FIG. 10.
Figure 12:
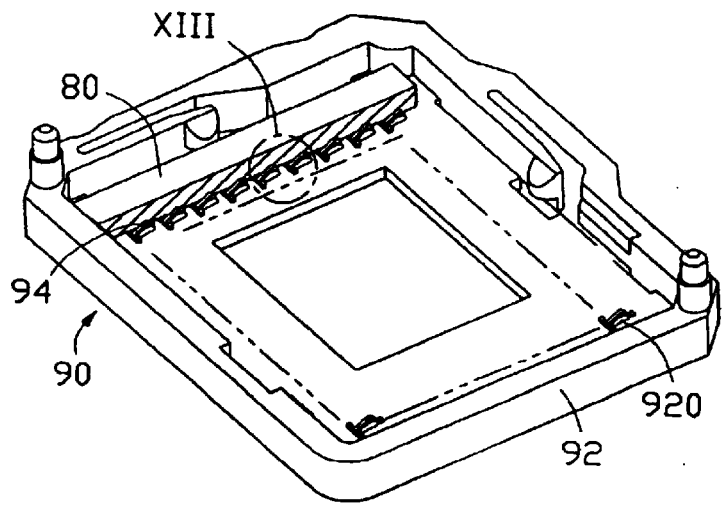
FIG. 12 is an isometric view of a conventional socket, showing a tool pressing pre-inserted contacts into corresponding terminal-cells of a housing of the conventional socket.
Figure 13:
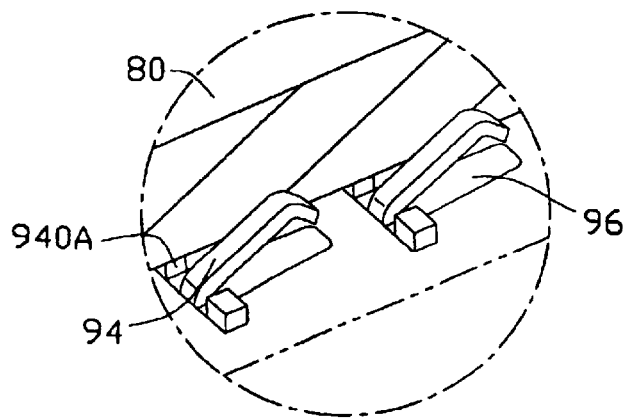
FIG. 13 is an enlarged view of a circled portion VIII of FIG. 12.
Figure 14:
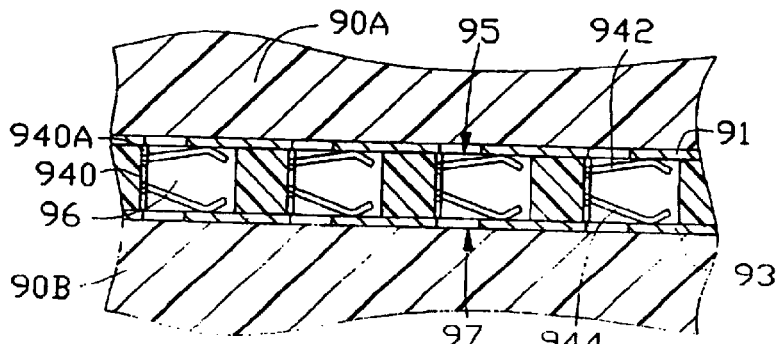
FIG. 14 is a cross section view of the conventional socket, together with an IC package having pads engaged corresponding contacts and a PCB having traces mated with said contacts.

Referring best to FIGS. 3, 6 and 7, a top protrusions 321 extends integrally upwardly from the top surface 322, at one side of the receiving section 320B of each terminal-passageway 320 and opposing to the securing section 320A of the terminal-passageway 320. The top protrusion 321 is adapted to uphold a pad 51 of the IC package 50A when the IC package 50A is secured in the cavity 36 of the housing 30. In order to facilitate said upholding, the top protrusion 321 has a parallelepiped configuration with a smooth top mounting surface to support said pad 51, and stands on a horizontal center line of the receiving section 320B. Furthermore, the top protrusion 321 has a uniform height h1 relative to the top surface 322, in a thickness direction of the bottom wall 32. Thereby the IC package 50A can steadily sit on the protrusions 321.

Referring to FIGS. 4, 5, 6 and 7, a lower projection 323 projects integrally downwardly from the lower surface 324, at one side of the receiving section 320B of each terminal-passageway 320 and opposing to the securing section 320A of the terminal-passageway 320. The lower projection 323 is aligned with a corresponding protrusion 321, in the thickness direction of the bottom wall 32. The lower projection 323 is used to support a trace 53 of the PCB 50B when the socket 20 fully engages the PCB 50B. To facilitate said supporting, the lower projection 323 has a parallelepiped configuration with a smooth lower mounting surface to support said trace 53, and stands on a horizontal center line of the receiving section 320B. The lower projection 323 has a uniform height h2 relative to the lower surface 324, in the thickness direction of the bottom wall 32. Thereby the PCB 50B can be assured to be parallel relative to the housing 30 after the PCB 50B fully engages the socket 20. Reliable engagement between the PCB 50B and the socket 20 is achieved.

Figure 2:
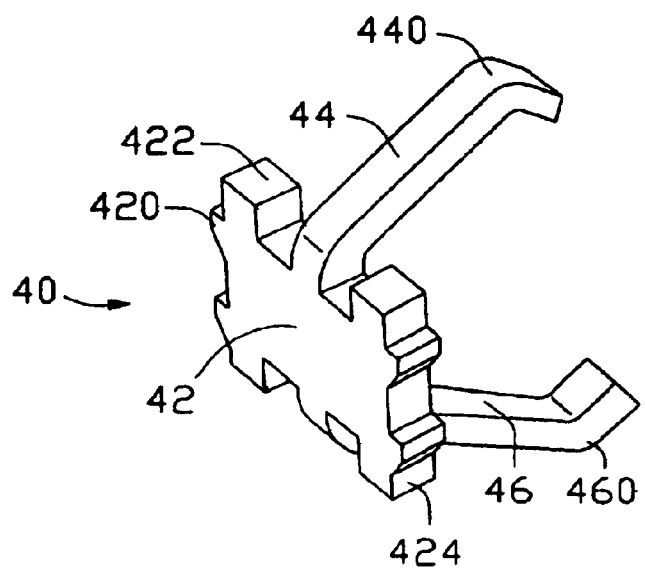
FIG. 2 is an enlarged, isometric view of one terminal of FIG. 1.

Referring to FIG. 2, the terminals 40 are formed from conductive material by known stamping process. Each terminal 40 is formed with a substantially rectangular retention body 42 and cantilever-shaped upper and lower arms 44, 46. A plurality of barbs 420 is formed on opposite lateral sides of the body 42, for engagingly intervening inner sides of the securing section 320A of a corresponding terminal-passageway 320. The upper arm 44 extends upwardly and slantwise from a middle of an upper end of the body 42. The lower arm 46 extends downwardly and slantwise from a middle of a lower end of the body 42.

Referring also to FIG. 6, an upper engaging portion 440 is formed at a topmost of the upper arm 44, for mechanically and electrically engaging a corresponding pad 51 of the IC package 50A. A lower engaging section 460 is provided at a bottommost of the lower arm 46, for mechanically and electrically mating with a corresponding trace 53 of the PCB 50B. The upper and lower arms 44, 46 are symmetrically orientated with respect to the body 42, and arranged at one side of the body 42.

In assembly, referring to FIGS. 8, 9, 10 and 11, before insertion of the terminals 40 into corresponding terminal-passageways 320, the terminals 40 are integrally attached to a contact strip 40A. The terminals 40 attached to the contact strip 40A are per-inserted into corresponding terminal-passageways 320 from the top surface 322 of the housing 30 in rows, upper ends 422 of the bodies 42 of the terminals 40 projecting beyond the upper surface 322.

To facilitate further securing of the pre-inserted terminals 40 in the terminal-passageways 320, a pressing tool 60 is provided. The pressing tool 60 has a rectangular plate 62 and a plurality of parallel ribs 64 depending perpendicularly from a side of the plate 62. A slot 66 is defined between two adjacent ribs 64, for receiving the upper arms 44 of a corresponding row of terminals 40. The slot 66 has a width wider than that of the upper arms 44, and a height higher than a vertical height of the upper arms 44 relative to the upper surface 322.

With this configuration, the pressing tool 60 is urged downwardly, the slots 66 thereof receiving the upper arms 44 of corresponding rows of terminals 40 and the ribs 64 standing on the upper ends 422 of the terminals 40. Exterior force is averted on the plate 62 of the pressing tool 60, thereby the ribs 64 are actuated to push the bodies 40 into the terminal-passageways 320. Consequently, the terminals 40 are steadily arranged in the terminal-passageways 320, the upper ends 422 of the bodies 42 flushing with the upper surface 322 and the lower ends 424 thereof projecting beyond the lower surface 324 a vertical distance h3 shorter than the distance h2 (best seen in FIG. 7).

In use, referring to FIGS. 6 and 7, the socket 20 is sandwiched between the PCB 50B and the IC package 50A, the cantilevers 342 of the housing 30 positioning the IC package in the cavity 36 of the housing 30. Exterior force is provided to press the PCB 50B and the IC package 50A to close toward each other until the pads 51 of the IC package 50A stand on the upper protrusions 321 and the traces 53 of the PCB 50B touch on the lower projections 323. During said pressing, the pads 51 of the IC package 50A press the upper engaging portions 440 of corresponding upper arms 44, thereby to force the upper arms 44 to resiliently deform and intrude into the receiving sections 320B of corresponding terminal-passageways 320. Reliability of mechanical and electrical engagement between the pads 51 and the upper engaging portions 321 is established. At the same time, the traces 53 of the PCB 50B quell the lower engaging sections 460 of corresponding lower arms 46, thereby to force the lower arms 46 to resiliently deform and enter into the receiving sections 320B of corresponding terminal-passageways 320. Reliability of mechanical and electrical engagement between the traces 53 and the lower engaging portions 460 is achieved.

In the preferred embodiment, the upper ends 422 of the bodies 42 of the terminals 40 flush with the upper surface 322 of the housing 30, and the upper protrusions 321 project the distance hi relative to the upper surface 322. Thereby the pads 51 of the IC package 50A have no chance to touch the upper ends 422 of the bodies 42. Furthermore, the lower ends 424 of the bodies 42 of the terminals 40 extend beyond the lower surface 324 of the housing 30 the distance h3 lower than the height h2 of the lower projections 323 with respect to the lower surface 324. The traces 53 of the PCB SOB are prevented from electrically engaging corresponding lower ends 424 of the bodies 40.

Furthermore, although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A socket for electrically interconnecting an electrical device having conductive members arranged thereon, the socket comprising:

a dielectric housing defining opposite mounting and mating surfaces, and a plurality of terminal-passageways extending therebetween and arranged in rows;

a plurality of terminals received in the terminal-passageways respectively, each of the terminals comprising a retention body secured in a corresponding terminal-passageway and cantilever opposite arms extending from the retention body past the mounting and mating surfaces, respectively; and a plurality of projections provided on said mounting and mating surfaces, and located along said rows and between the terminals;

wherein when the electrical device engages with the socket, each conductive member of the electrical device compresses the arm of a corresponding terminal, thereby establishing mechanical and electrical engagement therebetween, said projections supporting the electrical device to prevent the conductive member from electrically touching the parts of the retention bodies of other terminals adjacent said terminal; wherein when the electrical device engages with the socket, said conductive member rests on the corresponding projection; wherein the projections integrally extend from said mounting and mating surfaces; wherein each of the terminal-passageways has a securing section and a receiving section vertical to and in communication with the securing section; wherein each of the projections is situated at one side of the receiving section of a corresponding terminal-passageway, opposing to the securing section of said terminal-passageway.

* * * * *